United States Patent [19]

Testa et al.

[11] Patent Number: 5,434,746

[45] Date of Patent: Jul. 18, 1995

[54] PRINTED CIRCUIT BOARD ATTACHMENT MECHANISM

[75] Inventors: James Testa, Mountain View, Calif.; Joseph M. Spano, North Reading, Mass.; William L. Dailey, Redwood City, Calif.; Daniel D. Gonsalves, Nashua, N.H.; Robert S. Antonuccio, Burlington, Mass.; James M. Carney, Pepperel, Mass.; Mathew J. Palazola, Gloucester, Mass.

[73] Assignee: SUN Microsystems, Inc., Mountain View, Calif.

[21] Appl. No.: 182,440

[22] Filed: Jan. 13, 1994

[51] Int. Cl.6 ............................................. H05K 5/00
[52] U.S. Cl. ................................... 361/752; 361/759; 361/816; 211/41
[58] Field of Search ............... 361/725, 741, 756, 747, 361/752, 754, 759, 796, 790, 785, 800, 801, 802, 816; 211/41; 439/62, 73, 74

[56] References Cited

U.S. PATENT DOCUMENTS 5,291,368  3/1994  Conroy-Wass ................... 361/796

Primary Examiner—Leo P. Picard
Assistant Examiner—Young Whang

[57] ABSTRACT

An improved attachment mechanism for attaching the motherboard in a computer system to its chassis is disclosed. The attachment mechanism includes a rail that engages at least two opposing edges of the motherboard and a hook mechanism that engages a catch formed in the chassis. The hook mechanism is secured to a central portion of the motherboard. The rail and hook mechanism cooperate to securely couple the motherboard to the chassis without requiting the use of extensive usable space on the motherboard. The described arrangement permits the motherboard to be quickly and easily installed and released.

17 Claims, 3 Drawing Sheets

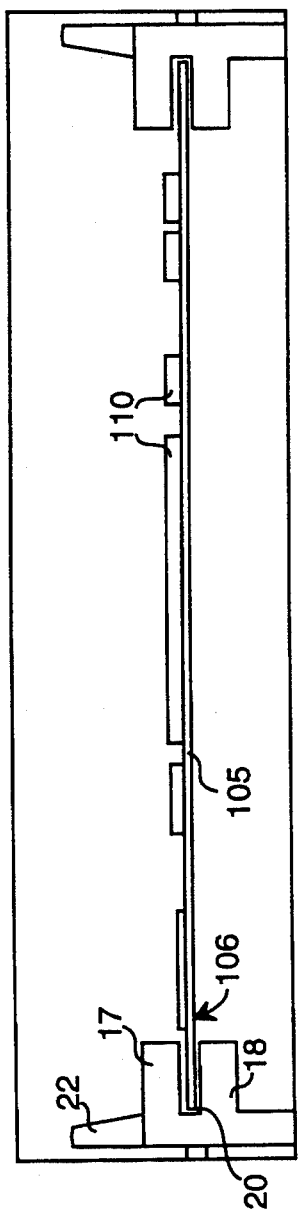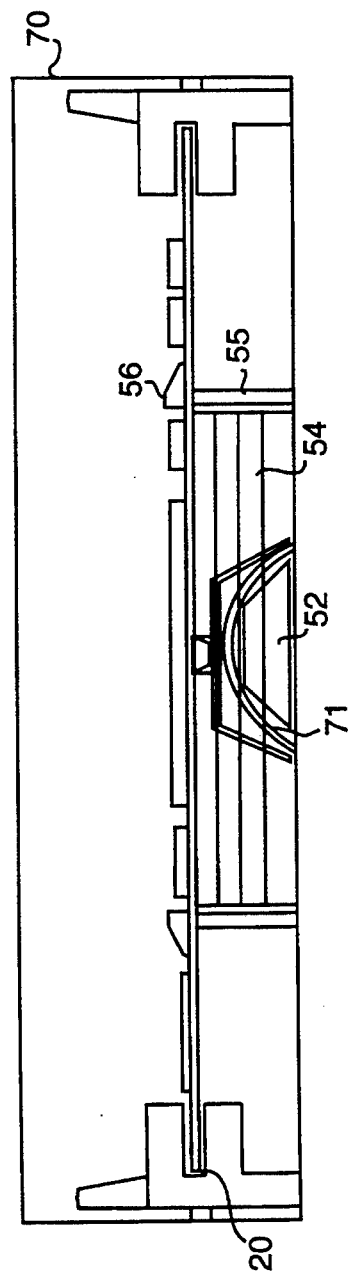

PRINTED CIRCUIT BOARD ATTACHMENT MECHANISM

BACKGROUND OF THE INVENTION

The present invention relates generally to mechanisms for attaching printed circuit boards to the chassis in a computer system. More particularly, an attachment mechanism particularly suited for securely coupling a computer's motherboard to its chassis is disclosed.

In modem computer systems, it is common to securely attach the motherboard to a chassis which is, in turn, secured to the casing which houses various internal components of the computer. In some circumstances, the chassis is integrated with the casing itself. The motherboard typically supports many, if not most, of the integrated circuits that are included in the computer system. Typically, the motherboard will also include one or more connectors adapted to receive expansion boards as well as SIMM connectors adapted to receive expansion memory.

It is important to firmly secure the motherboard to the chassis so that vibrations of the computer do not cause expansion boards to come loose or other components to be loosened and/or their connections damaged. In the prior art, there are a wide variety of different mechanisms that have been used to secure the motherboard to the chassis. By way of example, in one prior art arrangement, a plurality of keyhole slots are formed at central locations in the motherboard. The slots are adapted to fit over posts extending upward from the chassis base through enlarged opening portions of the keyhole slots. The motherboard is then slid over the posts such that the post shafts slide into the slot portions of the keyhole with a head portion of the posts being arranged to fit tightly over the top surface of the motherboard. In this way, the motherboard can be firmly anchored to the chassis, yet simply and easily removed. Although such an arrangement has worked well in the past, the plurality of keyholes formed in the central portion of the motherboard take up valuable real estate on the motherboard. Further, the printed circuit wiring within the motherboard must be routed around keyholes at the central locations on the motherboard. Accordingly, more complicated and longer routing paths are required which is disadvantageous and because it may hinder attempts to optimize the computer's speed.

Accordingly, the motherboard attachment mechanism of the present invention has been designed to firmly secure the motherboard to a chassis while retaining the ability to be quickly installed and released using a quick sliding motion and without requiring large amounts of valuable board space.

SUMMARY OF THE INVENTION

In accordance with the purpose of the present invention, an improved attachment mechanism for securely attaching the motherboard of a computer system to it's chassis is disclosed. The mechanism is arranged to permit the motherboard to be quickly and easily installed and released. In a first embodiment, a rail is securely coupled to the chassis. The rail includes a pair of spaced apart substantially parallel rail arms. Each rail arm includes upper and lower flanges that are spaced suitably to receive an edge of the motherboard therebetween. The rail arms are spaced appropriately to receive opposing edges of the motherboard to support the motherboard.

In another embodiment of the invention, a hook mechanism is coupled to a central portion of the motherboard. The hook mechanism is arranged to be closely received by a catch mechanism formed in the chassis. In a preferred embodiment the hook mechanism includes an elongated beam. A pair of spaced apart latch mechanisms are supported by the beam for coupling the beam to the motherboard. A hook extends from the beam for slidably engaging the catch mechanism.

In a another embodiment, the rail is substantially U-shaped and includes a connecting rail that extends between the spaced apart arms. The connecting rail also includes upper and lower flanges that are spaced and positioned suitably to receive a third edge of the motherboard to provide further support for the motherboard.

In yet another embodiment, the chassis is formed integrally with a casing that encloses the motherboard and various peripherals such as a disk drive. In embodiments where the catch is stamped out of the casing, it may be desirable to include a shield positioned over the hook above the location at which the hook will engage the catch in order to prevent to prevent hot oil from dripping through the printed circuit board out through the hole made in the chassis in forming the catch.

BRIEF DESCRIPTION OF THE DRAWINGS

The invention, together with further objects and advantages thereof, may best be understood by reference to the following description taken in conjunction with the accompanying drawings in which:

FIG. 2 is a cross sectional view of an integral casing chassis with a rail and hook mechanism cooperating to firmly secure a motherboard in place.

FIG. 4 is a cross sectional view highlighting the connection between an integral casing chassis and a motherboard using the hook mechanism shown in FIG. 3.

Figure 1:
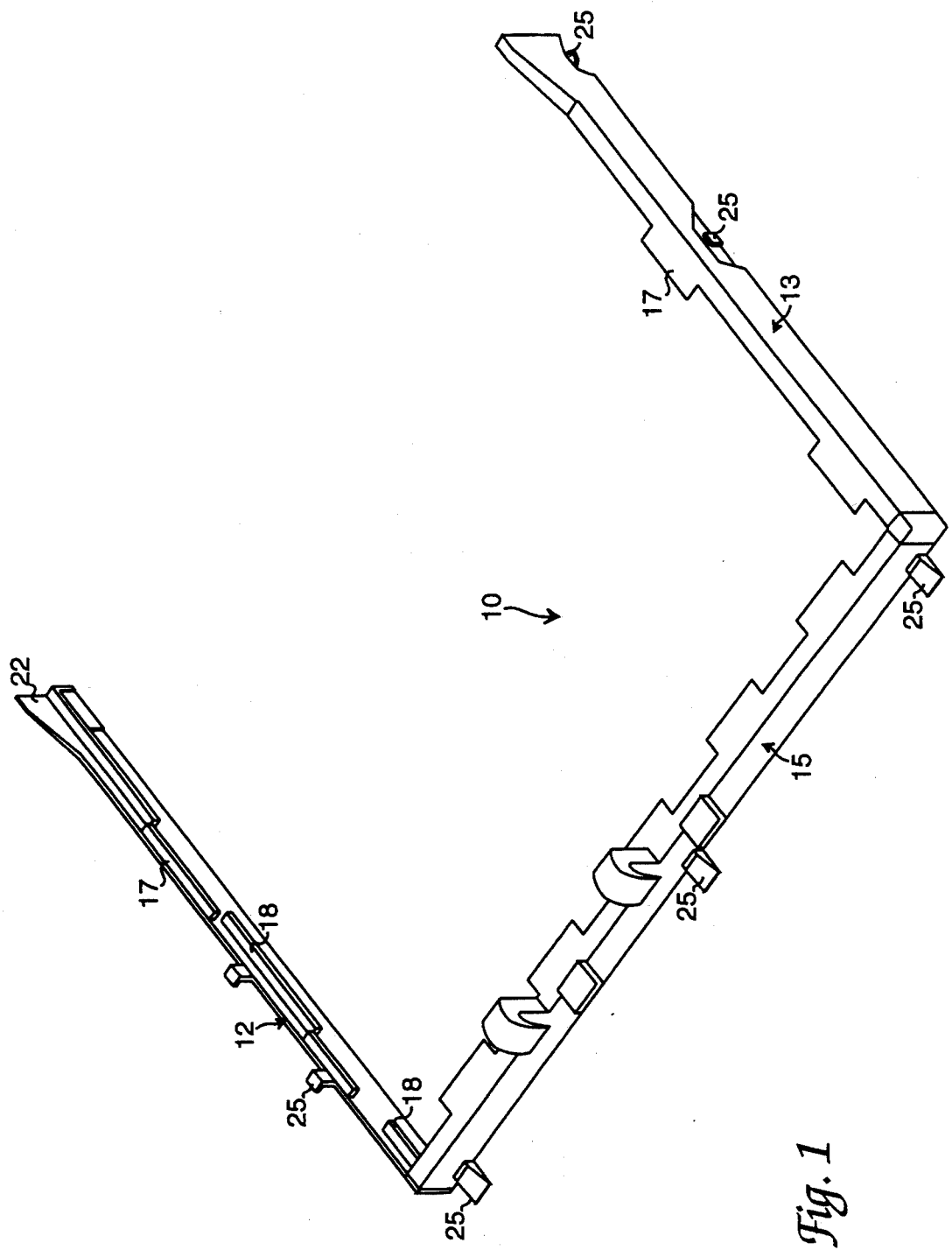
FIG. 1 is a perspective view of a rail suitable for use in the present invention.

DETAILED DESCRIPTION OF THE INVENTION.

The motherboard support system of the present invention is designed to firmly secure the motherboard 105 to a computer chassis 108 yet permit the motherboard to be quickly and easily installed and released from the chassis through the use of a simple sliding movement. The described embodiment has two major parts. The first is a rail 10 that is mounted to the chassis and has slots that receive opposing edges of the motherboard. The second is a hook mechanism 50 which is adapted to be secured to the motherboard. The hook mechanism 50 has a hook 52 that engages a chassis catch 70.

Referring initially to FIGS. 1 and 2, the rail 10 will be described first. The rail 10 is substantially U-shaped and thus includes two spaced apart substantially parallel rail arms 12,13 which are connected by a connecting rail 15. Each arm of the rail 10 (including connecting rail arm 15) has upper and lower flange members 17, 18. The flanges may be continuous, however in the embodiment shown they are segments into a plurality of flange members. The flange members 17 and 18 extend substantially parallel with one another to effectively form a slot 20 therebetween that is sized appropriately to receive an edge 106 of motherboard 105. The rail arms 12, 13 are spaced apart appropriately so that opposing edges 106 of the, printed circuit motherboard will simultaneously slide into the slots 20 during installation. The connecting rail arm 15 supports the back edge of the motherboard in the same manner as the side arms 12 and 13 support the side edges.

In the embodiment shown in FIG. 1, the ends of the U-shaped rail 10 include enlarged tips, the inner surfaces of which are splayed slightly outward. Further, only the lower flange members 18 extend to the tips 22. This facilitates easy installation of the motherboard. Particularly with the hook mechanism 50 installed as described below. Specifically, the back end of the motherboard can be set on the outer lower flange members in the widened tip area and then slide inward into place. Typically, the motherboard would be initially set at a relatively small angle. Then, as the motherboard 10 is slide inward, the first pair of upper flange members 17 will force the motherboard to flatten out into a flat position with respect to the rail 10. Thus, installation and removal from the rail is extremely easy.

The rail 10 may take the form of a unitary injection molded piece. It may include a plurality of tabs 25 that are designed to engage the chassis to firmly hold the rail in place. The tabs may take a variety of shapes to accommodate specific design requirements. Further, additional parts such as wiring holders 27 may be integrally formed with the rail 10. In the embodiment shown in FIG. 1, the wiring holders 27 are arranged to keep wiring bundles in place.

Figure 3:
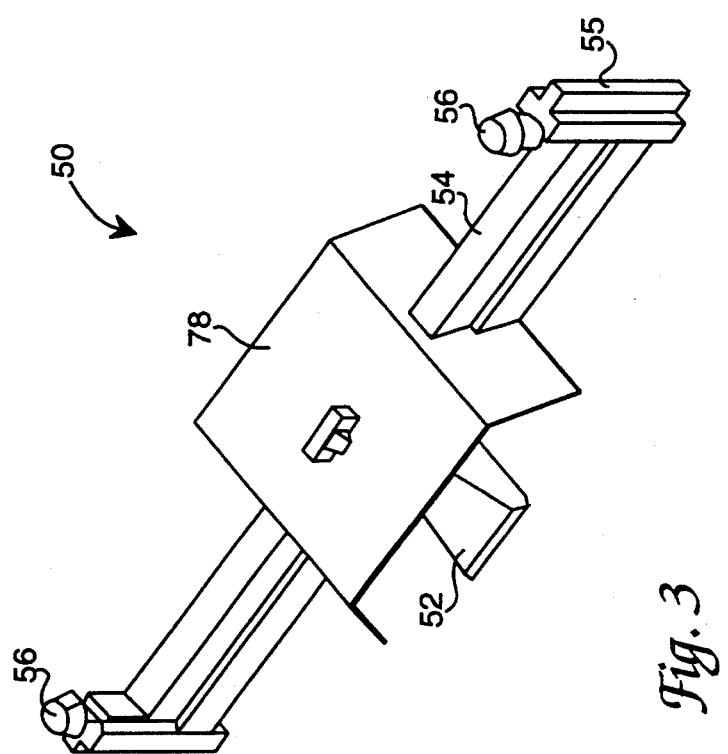
FIG. 3 is a perspective view of a hook mechanism suitable for use in the present invention.

Referring next to FIGS. 3 and 4, the hook mechanism 50 will be described. As best seen in FIG. 3, hook mechanism 50 includes a beam 54 having a couple of posts 55 located at opposite ends thereof. Each post 55 has a latches 56 mounted on its top surface. The latches 56 are designed to snap into small openings formed in the motherboard 105 to firmly secure the hook mechanism 50 to the motherboard. The hook 52 is secured to the bottom of a central portion of the beam 54. The hook 52 takes the form of a foot that is designed to slide relatively tightly underneath a small catch loop 71 formed in the chassis 70. The catch loop 71 may simply be a bridge arrangement stamped from the chassis. In the embodiment shown, the chassis is incorporated into the casing itself. Therefore, stamping a bridge out of the casing will cause a slot-like opening to be formed in the casing under the bridge. To prevent debris from entering the housing and/or hot oils from dripping out of the casing in the unlikely event of overheating causing melting of board components, a shield 78 is formed over the foot. When the hook is in the engaged position, the shield 78 relatively closely covers the chassis catch loop 71 which during a serious overheating failure will prevent melted material from flowing out of the casing and thereby posing any potential fire risks.

It should be appreciated that the same simple motion described above with reference to installing the motherboard into the rail will cause the hook to slide directly into place. That is, with the back end of the board placed on the outer lower rail flanges and the front end tilted slightly upward, the board is pushed gently inward. The raising of the front end insures that the 3hook does not catch on the edge of the chassis during installation. As the motherboard 105 is moved inward, it is forced into a flattened position by the combined effect of the front upper and lower flanges. This flattening motion swings the hook 52 into place and as the motherboard is pushed further inward, the hook slides into place underneath the catch loop 71. Simultaneously, the back edge of the board 105 slides into the slot 20 formed between the upper and lower flanges of the connecting rail arm 15.

When used together, the described rail and hook systems firmly support a printed circuit board with minimal vibrations, yet permit very simple installation and removal of the board. One advantage of the described arrangement is that it requires a very small portion of prime board space. Specifically, the edges of the board 106 are used to secure the board when the boards are placed in a burn in oven during testing as well as during assembly. Therefore, the ,edges 106 are not really usable as space for surface wiring and/or for mounting components. Thus, the board space required for the holes that receive latches 56 is the only prime space that is required for the described mounting system. Reducing the amount of prime board space required to secure the motherboard has several beneficial effects. For example, the wiring routing will be less disrupted which will permit more efficient routing. Better routing may lead to simpler design and can make speed improvements easier as well. Further, more surface space is available for a given board size which may also be advantageous.

Although only one embodiment of the present invention has been described, it should be understood that the present invention may be embodied in many other specific forms without departing from the spirit or scope of the invention. Particularly, the invention was described in terms of a mechanism for mounting the motherboard of a desktop type computer. However, of course, the invention can also be used to anchor other types of printed circuits boards as well. Further, although in the described embodiment, the hook and rail mechanisms are used together advantageously, in certain circumstances, it may be desirable to use the systems independently. Therefore, the present examples are to be considered as illustrative and not restrictive, and the invention is not to be limited to the details given herein, but may be modified within the scope of the appended claims.

We claim:

1. In a computer system including a motherboard that supports a multiplicity of components including integrated circuits and has printed circuit wiring that electrically connects various components to one another, and a chassis for supporting the motherboard, and an attachment mechanism for securely coupling the motherboard to the chassis, the attachment mechanism comprising:

a rail mechanism that is securely coupled to the chassis, the rail mechanism including a pair of spaced apart substantially parallel rail arms, wherein each rail arm includes upper and lower flanges, the flanges being spaced suitably to receive and support an edge of the motherboard there between; and wherein the rail arms are spaced appropriately to slidably receive opposing edges of the motherboard to support the motherboard, whereby the rail mechanism is arranged to permit the motherboard to be quickly and easily installed and released from the chassis by a simple sliding movement.

2. A motherboard attachment mechanism as recited in claim 1 wherein the rail further includes a connecting rail that extends between said pair of spaced apart rail arms, the connecting rail also including upper and lower flanges that are spaced and positioned suitably to receive a third edge of the motherboard to provide further support for the motherboard.

3. A motherboard attachment mechanism as recited in claim 2 wherein the rail is substantially U-shaped.

4. A motherboard attachment mechanism as recited in claim 3 further comprising:
  a hook mechanism coupled to a central portion of the motherboard; and
  wherein the chassis further includes a catch mechanism that receives said hook mechanism to provide additional support for the motherboard.

5. A computer system as recited in claim 1 wherein said chassis is part of a casing that encloses the motherboard.

6. A computer system as recited in claim. 1 wherein the rail flanges are each separated into a multiplicity of spaced apart rail flange segments.

7. A motherboard attachment mechanism for use in a computer system including a motherboard that supports a multiplicity of components including integrated circuits and has printed circuit wiring that electrically connects various components to one another, and a chassis for supporting the motherboard, the attachment mechanism being arranged for securely coupling the motherboard to the chassis, the attachment mechanism comprising:
  a rail mechanism that is securely coupled to the chassis, the rail mechanism including a pair of spaced apart substantially parallel rail arms, wherein each rail arm includes upper and lower flanges, the flanges being spaced suitably to receive and support an edge of the motherboard there between;
  wherein the rail arms are spaced appropriately to slidably receive opposing edges of the motherboard to support the motherboard, whereby the rail mechanism is arranged to permit the motherboard to be quickly and easily installed and released from the chassis by a simple sliding movement;
  a hook mechanism coupled to a central portion of the motherboard; and
  wherein the chassis further includes a catch mechanism that receives said hook mechanism to provide additional support for the motherboard.

8. In a computer system including a motherboard that supports a multiplicity of components including integrated circuits and has printed circuit wiring that electrically connects various components to one another, and a chassis for supporting the motherboard, an attachment mechanism for securely coupling the motherboard to the chassis, the attachment mechanism comprising:
  a hook mechanism coupled to a first one of the motherboard or said chassis; and
  a catch mechanism formed in a second one of said motherboard or said chassis for tightly slidably receiving said hook mechanism to provide support for the motherboard, whereby the hook and catch mechanisms are arranged to permit the motherboard to be quickly and easily installed and released from the chassis by a simple sliding movement.

9. A motherboard attachment mechanism as recited in claim 8 further comprising a rail that is securely coupled to the chassis, the rail including a pair of spaced apart substantially parallel rail arms, wherein each rail arm includes upper and lower flanges, the flanges be spaced suitably to receive an edge of the motherboard therebetween and wherein the rail arms are spaced to receive opposing edges of the motherboard to provide further support for the motherboard.

10. A motherboard attachment mechanism as recited in claim 8 wherein the hook mechanism is coupled to the motherboard and includes:
  an elongated beam;
  a pair of spaced apart latch mechanism supported by the beam for coupling the beam to the motherboard; and
  a hook supported by the beam for engaging the catch mechanism.

11. A motherboard attachment mechanism as recited in claim 10 further comprising a shield carried by said beam and positioned substantially over said hook mechanism for covering an opening in said catch mechanism to prevent hot materials from leaking from the chassis.

12. A motherboard attachment mechanism as recited in claim 10 wherein the latch mechanisms are arranged to be inserted into holes formed in the motherboard.

13. A computer system as recited in claim 8 wherein said chassis is formed integrally with a casing that encloses the motherboard.

14. A computer system comprising:
  a motherboard that supports a multiplicity of components including integrated circuits and has printed circuit wiring that electrically connects various components to one another;
  a chassis for supporting the motherboard, the chassis including a catch;
  an elongated beam;
  a pair of spaced apart latch mechanism supported by the beam for coupling the beam to a central portion of the motherboard;
  a hook supported by the beam for slidably engaging the catch to provide support for the motherboard; and
  a substantially U-shaped rail securely coupled to the chassis, the rail including upper and lower :flanges that are spaced suitably to receive an edge of the motherboard therebetween, the rail being sized appropriately to receive and support three adjoining edges of the motherboard; and
  whereby the hook and rail are arranged to permit the motherboard to be quickly and easily installed and released from the chassis by a simple sliding movement.

15. A computer system as recited in claim 14 wherein said chassis is formed integrally with a casing that encloses the motherboard.

16. An attachment mechanism in a computer system as recited in claim 15 further comprising a shield carried by said beam and positioned substantially over said hook mechanism for covering an opening located below the catch mechanism.

17. An attachment mechanism in a computer system as recited in claim 15 wherein the latch mechanisms are arranged to be inserted into holes formed in the motherboard.

* * * * *